United States Patent [19]
Johnson et al.

[11] Patent Number: 5,211,803
[45] Date of Patent: May 18, 1993

[54] PRODUCING METAL PATTERNS ON A PLASTIC SURFACE

[75] Inventors: Timothy W. Johnson, Bartlesville, Okla.; Mark L. Stone, Idaho Falls, Id.

[73] Assignee: Phillips Petroleum Company, Bartlesville, Okla.

[21] Appl. No.: 859,649

[22] Filed: Mar. 23, 1992

Related U.S. Application Data

[63] Continuation of Ser. No. 415,880, Oct. 2, 1989, abandoned.

[51] Int. Cl.$^5$ .............................................. C23C 26/00
[52] U.S. Cl. ...................... 156/625; 427/96; 427/305; 427/306; 427/307; 427/551; 427/554
[58] Field of Search ............... 427/96, 306, 305, 307, 427/35, 53.1, 551, 594; 156/625

[56] References Cited

U.S. PATENT DOCUMENTS

| | | | |
|---|---|---|---|
| 3,354,129 | 11/1967 | Edmonds | 526/280 |
| 4,109,029 | 8/1978 | Ozdemin | 427/96 |
| 4,199,408 | 4/1980 | Sherman | 204/15 |
| 4,344,870 | 8/1982 | Blinne et al. | 252/517 |
| 4,375,427 | 3/1983 | Miller et al. | 252/512 |
| 4,382,882 | 5/1983 | Vogel et al. | 252/503 |
| 4,395,497 | 7/1983 | Naarmann et al. | 523/135 |
| 4,407,739 | 10/1983 | Naarmann et al. | 252/512 |
| 4,447,471 | 5/1984 | Putt et al. | 427/98 |
| 4,452,727 | 6/1984 | Frommer et al. | 252/518 |
| 4,462,929 | 7/1984 | Shacklette et al. | 252/518 |
| 4,486,463 | 12/1984 | Rubner et al. | 427/53.1 |
| 4,527,219 | 7/1985 | Johnson et al. | 361/323 |
| 4,532,015 | 7/1985 | Boultinghouse et al. | 204/38.4 |
| 4,532,152 | 7/1985 | Elarde | 427/96 |
| 4,540,620 | 9/1985 | Johnson et al. | 427/195 |
| 4,540,631 | 9/1985 | Boultinghouse | 428/419 |
| 4,555,414 | 11/1985 | Hoover et al. | 427/43.1 |
| 4,560,580 | 12/1985 | Needham | 427/96 |
| 4,615,907 | 10/1986 | Boeke et al. | 427/53.1 |
| 4,654,225 | 3/1987 | Needham | 427/53.1 |
| 4,666,735 | 5/1987 | Hoover et al. | 427/43.1 |
| 4,812,275 | 3/1989 | Yumoto | 427/96 |
| 4,812,353 | 3/1989 | Yumoto | 427/96 |
| 5,015,519 | 5/1991 | Yumoto | 427/96 |

FOREIGN PATENT DOCUMENTS 1072217  2/1980  Canada .................................. 427/96

OTHER PUBLICATIONS

Exhibit A–GTE Profile, Mar./Jun., 1963.
Exhibit B–C&EN, Sep. 10, 1984, p. 37, article entitled "Process Makes Flexible Printed Circuit Boards".
Exhibit C–Polymer preprints, vol. 25, No. 2, Aug., 1984, pp. 280–281.
Exhibit D–Journal of Electronic Materials, vol. 11, No. 2, Mar., 1982, pp. 261–272.

*Primary Examiner*—Shrive Beck
*Assistant Examiner*—Vi Duong Dang
*Attorney, Agent, or Firm*—Laney, Dougherty, Hessin & Beavers

[57] ABSTRACT

Poly(arylene sulfide) articles having plated metal paths thereon are disclosed. A pattern of areas of lesser crystallinity and areas of higher crystallinity is created in the polymer morphology of a surface of the article. The surface is then exposed to a chemical etchant selectively active upon the areas of lesser crystallinity thereby etching those areas of lesser crystallinity while leaving areas of higher crystallinity substantially unaffected. Then a conductive metal is deposited on the etched areas of lesser crystallinity by an electroless plating process. Subsequent electroplating can also be used.

25 Claims, No Drawings

PRODUCING METAL PATTERNS ON A PLASTIC SURFACE

This is a continuation of copending application(s) Ser. No. 07/415,880 filed on Oct. 2, 1989, abandoned.

BACKGROUND OF THE INVENTION

1. Field of the Invention

The invention relates generally to the formation of metal patterns on a plastic surface, and more particularly, but not by way of limitation, to the production of printed circuit boards.

2. Description of the Prior Art

The current practice for making conductive paths in such applications as printed circuit boards and integrated circuits generally falls into two categories. One is the etching from a completely conducting sheet of the areas desired to be non-conducting, which is generally referred to as a subtractive method. The other method, commonly known as the additive method, is to metal-coat a substrate while preventing metal contact with non-conducting areas. Such a coating process usually involves plating or vacuum deposition of metal. Simpler methods and less expensive materials are constantly being sought for such applications.

One particular group of materials which have been found promising for use as a substrate for such printed circuit boards are poly(arylene sulfide) materials which due to their stability at high temperatures, and their resistance to various chemicals, have found ever broadening areas of application.

U.S. Pat. No. 4,615,907 to Boeke et al., and assigned to the assignee of the present invention, discloses one technique for electroless plating of poly(arylene sulfide) surfaces which have been made water-wettable through laser treatment.

U.S. Pat. No. 4,486,463 to Rubner et al., and assigned to GTE Laboratories, Inc., discloses another process for plating poly(phenylene sulfide) articles. The Rubner et al. process is based upon creating a selective pattern of crystallization on the surface of the poly(phenylene sulfide) material, as is the present invention, but the process itself is very different. The Rubner et al. process plates the crystalline areas of the surface, whereas the present invention as described below plates the non-crystalline areas of the surface through a very different technique.

U.S. Pat. Nos. 4,540,620 and 4,527,219, both to Johnson et al., and both assigned to the assignee of the present invention, disclose that amorphous areas of a poly(arylene sulfide) surface can be made electrically conductive by doping the same with nitrosonium hexafluorophospate in concentrations on the order of about one to one and one-half percent in a solvent carrier. Example V of U.S. Pat. No. 4,540,620 discloses the use of an electron beam to form amorphous areas prior to doping. The doping of the amorphous areas in the '620 and '219 patents is done only with relatively low concentrations of nitrosonium hexafluorophospate, which are not sufficient to actually etch the amorphous areas of the substrate. The doping is done for the purpose of creating an electrically conductive surface. No plating of any kind was applied in the processes of the '620 and '219 patents, since they were directed to the production of electrically conductive patterns in the material so as to provide circuitry without the need for plating.

U.S. Pat. No. 4,540,631 to Boultinghouse, and U.S. Pat. No. 4,532,015 to Boultinghouse et al., both assigned to the assignee of the present invention, deal generally with electroless plating methods.

SUMMARY OF THE INVENTION

The present invention provides methods for producing plated paths on articles, and provides articles produced by such methods.

A pattern of areas of lesser crystallinity and areas of higher crystallinity is created in the polymer morphology of a surface of a poly(arylene sulfide) article. That surface is then exposed to a chemical etchant selectively active upon the areas of lesser crystallinity thereby etching those areas of lesser crystallinity while leaving areas of higher crystallinity substantially unaffected. Then, a conductive metal is deposited on the etched areas of lesser crystallinity by an electroless plating process.

Preferably, the pattern of areas of lesser and higher crystallinity is formed by beginning with an article having an initially crystalline area, and then selectively exposing that surface to an electron beam to form the areas of lesser crystallinity.

The chemical etching is preferably performed with a 4% wt/vol concentration of nitrosonium hexafluorophospate in a 70/30 nitromethane/methylene chloride mixture.

The electroless plating process is performed after the chemical etching, and includes a step of exposing the surface to a catalyst bath. Then the surface is wiped to remove catalyst from areas of higher crystallinity while leaving catalyst in the etched areas of lesser crystallinity. Then the conductive metal is deposited from the plating solution on the etched areas of lesser crystallinity containing the catalyst.

Poly(arylene sulfide) articles formed by these processes have a surface with a pattern of areas of lesser crystallinity and areas of higher crystallinity defined thereon. The areas of lesser crystallinity are plated with a conductive metal and the areas of higher crystallinity are metal free electrically insulating areas.

Numerous objects, features and advantages of the present invention will be readily apparent to those skilled in the art upon a reading of the following disclosure.

DETAILED DESCRIPTION OF THE INVENTION

In accordance with the present invention plated paths are produced on a poly(arylene sulfide) article by first creating a pattern of areas of lesser crystallinity and areas of higher crystallinity in the polymer morphology of a surface of the article. Then the surface is exposed to a chemical etchant which is selectively active upon the areas of lesser crystallinity, thereby etching those areas of lesser crystallinity while leaving the areas of higher crystallinity substantially unaffected. After the etching step, a conductive metal is deposited on the etched areas of lesser crystallinity by an electroless plating process. Additional electroplating can also be added. The resulting product is useful, for example, as a printed circuit board.

Poly(arylene Sulfide)

The substrate, for purposes of this invention is a poly(arylene sulfide) article such as for example a board, sheet, block, plate, disc, or the like. Where the substrate employed is in the shape of a board, it is preferably an injection molded board with molded-in holes, useful, for example, for construction of printed circuit boards. Poly(arylene sulfide) is used herein to designate arylene sulfide polymers.

Without being limited thereto, uncured or partially cured poly(arylene sulfide) whether homopolymer, copolymer, terpolymer, and the like, or a blend of such polymers, can be used in the practice of the invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein. Examples of poly(arylene sulfide) polymers suitable for purposes of the invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide). Various poly(arylene sulfides) are commercially available under the trademark Ryton® from Phillips Petroleum Company, Bartlesville, Okla.

Fillers And Other Additives

Various fillers can be used in the compositions useful for the practice of this invention. Typical fillers include fiberglass, talc, mica, silica, calcium carbonate and calcium sulfate.

For the inventive process it is not necessary for the material to contain a filler, but if it does, it is important that there be a smooth resinous surface on the material which is not significantly interrupted by the filler.

Although not required for the practice of the present invention, additional composition components may include mercaptosilanes, processing aids (e.g., mold release agents), corrosion inhibitors, stabilizers and the like.

Polyethylene and zinc stearate are examples of useful mold release agents. An example of a corrosion inhibitor is lithium carbonate.

Creating A Pattern Of Amorphous Areas

The present invention takes advantage of the discovery that at relatively high concentrations $NOPF_6$, generally referred to as nitrosonium hexafluorophosphate or nitrosyl hexafluorophosphate, will selectively etch amorphous areas, that is areas of lesser crystallinity and will leave unaffected crystalline areas of a poly(arylene sulfide) surface, and particularly of a poly(phenylene sulfide) surface. These etched amorphous areas are then particularly susceptible to selective plating in an electroless plating process.

In order to take advantage of this phenomena, it is first necessary to create a pattern of amorphous areas, that is areas of lesser crystallinity, and crystalline areas, or more generally areas of higher crystallinity, in the polymer morphology of such a surface.

This can be accomplished in a number of ways. The process can begin with a surface which is initially a crystalline surface, and then areas of the surface can be selectively treated to form amorphous areas. The process can also begin with a surface that is initially amorphous, and selective areas can be treated to make those treated areas crystalline, thus leaving the desired amorphous pattern.

Electron Beam

A preferred technique for creating a pattern of amorphous areas and crystalline areas is to begin with a poly(phenylene sulfide) article having a surface which is initially crystalline in nature, and then to selectively expose that surface to an electron beam which is scanned across the polymer surface at a specified rate and according to a predetermined pattern. The energy absorbed by a piece of poly(phenylene sulfide) from the electron beam in a scanning electron microscope under certain conditions is sufficient to bring about a morphology change from crystalline to amorphous. The voltage through which the electron beam is accelerated is typically 10,000-30,000 volts. The current is typically $10^{-7}$ to $10^{-6}$ amps.

In many cases it has been observed that the electron beam will actually form a conductive black line on the material. Line widths from as small as 0.001 inch have been observed, but more typical line widths which can be created by an electron beam are in the range of 0.003-0.008 inch. The electron beam will typically penetrate the surface about 0.004-0.006 inch. When the electron beam strikes the poly(phenylene sulfide) it creates a line or path consisting of two distinct regions. The central region is a blackened carbonaceous track; it is roughly spherical when viewed in cross section. The second region is an amorphous layer which lies between the dark track and the rest of the sample. These two regions, the dark layer and the intermediate surrounding region are both later etched by the nitrosonium hexafluorophosphate etching solution and provide sites for subsequent metal adhesion in the electroless plating process.

By varying the magnification, scan speed, and by moving the poly(phenylene sulfide) structure under the electron beam using the external micrometers of a scanning electron microscope, it is possible to create intricate patterns consisting of straight lines and lines with right angle turns in them. In addition to other parameters, due to the scanning nature of the beam, there is also a direction of travel dependence on the quality of the line produced. In some observations, each clearly resolved scanning sweep of the electron beam will be visible on the poly(phenylene sulfide) surface.

One scanning electron microscope which has been found suitable for use in the inventive process is a Hitachi S-450 scanning electron microscope. For patterning purposes the current and other parameters are adjusted to give the maximum current output. A typical current, as measured using a Keithley 610c electrometer attached to the appropriate BNC connector on the microscope stage, needs to be in the range of $10^{-7}$ to $10^{-6}$ amps. The condenser lens should be set on zero. A working distance of approximately ten millimeters is appropriate. The sample can be moved at a rate of approximately one millimeter per second. The acceleration voltage is set at 25 kilovolts. Saturation current is 100. The strip aperture is set on the 400 micron diameter hole. The line width is controlled by the magnification, and higher power gives narrower lines. With the apparatus just described, magnification can typically be set at 4,000×, but many other settings may be used as well. The electron beam is typically focused on the top surface of the sample.

Other Techniques For Creating Amorphous And Crystalline Patterns

Several other techniques may be used for creating amorphous and crystalline patterns in a poly(arylene sulfide) material.

One technique is solvent induced crystallization. With an adequate masking system it is possible to solvent induce poly(arylene sulfide) material to crystallize in a predetermined pattern. The mask must prevent the liquid or vapor from contacting the regions which are to remain amorphous. Masks can be constructed from adhesive tape. One preferred solvent for crystallization purposes is methylene chloride. Other solvents which will crystallize poly(phenylene sulfide) include toluene, xylene, dichloromethane, dichloroethane, chloroform, trichlorobenzene, and tetrahydrofuran. The penetration rate is such that fifteen to twenty minutes of exposure to the liquid at room temperature is completely adequate. However the exposure time can be reduced significantly if the solvent is hot.

Another technique is the use of a laser. A pulsed high power $CO_2$ laser can be utilized to selectively crystallize areas of the polyphenylene sulfide by heating it above its crystallization temperature of approximately 130° C. Beginning with an initially amorphous surface, the laser crystallizes areas which are treated by the laser, thus leaving amorphous areas. Subsequent chemical etching steps then selectively act upon the amorphous areas, i.e., the areas which were not treated by the laser. Subsequent metal plating also is selectively applied to the amorphous areas which are the areas which were not treated by the laser.

Another technique for forming amorphous crystalline patterns is to begin with an initially amorphous structure and then directly apply heat through contact of the surface with a hot object. Hot materials such as metal objects of various shapes and sizes, or soldering irons, can be utilized to produce a change in morphology. When a piece of amorphous poly(phenylene sulfide) is touched with a metal washer heated to 350°-400° F., it has been observed that the affected areas become crystalline.

Another technique of creating amorphous areas is to rapidly heat with a laser above the melting point of the polyphenylene sulfide followed by rapid cooling to quench the treated areas in an amorphous state.

Chemical Etching Of The Amorphous Areas

The preferred chemical etchant for poly(phenylene sulfide) materials is $NOPF_6$. Although the inventors have previously disclosed in U.S. Pat. Nos. 4,527,219 and 4,540,620 that this chemical in concentrations on the order of 1% to 1½% will dope amorphous regions of poly(phenylene sulfide) to bring about an increase in electrical conductivity, they have now discovered that greater concentrations of this same chemical will selectively etch the amorphous regions of the poly(phenylene sulfide) producing microcaverns, channels, and bulbous looking structures on an originally smooth area.

The nitrosonium hexafluorophosphate is preferably utilized in a concentration of a least about 3%, and even more preferably at least about 4% wt/vol in a solvent solution of 70/30, v/v, mixture of nitromethane/methylene chloride, e.g., four grams of nitrosonium hexafluorophosphate are added to 100 ml. of a 70/30 v/v, mixture of nitromethane/methylene chloride. The nitrosonium hexafluorophosphate is insoluble in methylene chloride, so the nitromethane is necessary as the solvent for the nitrosonium hexafluorophosphate. The methylene chloride, on the other hand, causes the poly(phenylene sulfide) to swell and acts as an agent to help facilitate the penetration of the nitrosonium hexafluorophosphate. Generally about ten minutes etching time at room temperature is satisfactory. Examination by scanning electron microscope of samples of polyphenylene sulfide material etched in the manner just described has shown that often there is a thin skin on many of the treated surfaces. The etching solution will penetrate the skin and etch the material just under it. The skin does not seem to be affected by the nitrosonium hexafluorophosphate, and it is thought that the skin may be a thin crystalline, or perhaps air oxidized or crosslinked, material. Nevertheless, the skin acts as a weak boundary layer, and should be removed. Wiping the surface of the polyphenylene sulfide material with a rag or cheesecloth after etching and rinsing in pure nitromethane, will remove the skin and expose the undamaged underlying etched material.

The nitrosonium hexafluorophosphate may be obtained as a white crystalline solid from Ozark-Mahoning of Tulsa, Okla. Nitrosonium hexafluorophosphate reacts with water to produce noxious NO gas and $PF_6$ salts. It can decompose further to produce HF, so it must be handled with care. All etching bath preparations and reactions should be carried out in a dry box having an argon atmosphere, or similar apparatus.

Electroless Plating Processes

Many electroless plating processes are commercially available. These processes result in the deposition of a metallic plating or film onto a substrate by the interaction in solution of a metal salt and a chemical reducing agent, whereby the chemical reduction is catalyzed by the metal or alloy being deposited. In the practice of this invention the electroless metal can be any conductive metal capable of being used in an electroless plating operation. Copper and nickel are two such metals, each being especially well suited for this purpose. The term conductive metal is intended to include conductive alloys.

The following preferred electroless plating procedure is conventional except for the important addition of step (c), the wiping step, which follows the exposure to catalyst and the first rinsing step. This wiping step is very significant in the overall process of the present invention due to the fact that the previously etched amorphous areas of the polyphenylene sulfide surface are to be utilized as a reservoir for the catalyst to subsequently cause metal plating of the etched areas. The wiping step serves to remove catalyst from the smooth crystalline non-etched areas, thus leaving catalyst in the etched amorphous areas which are to be plated, thus resulting in selective plating of the etched amorphous areas.

The preferred electroless plating process includes the following steps:
   (a) immersion in a Pd/Sn catalyst bath to put down a layer of catalyst which reduces the copper in a later step and causes it to precipitate or plate out on the surface;
   (b) a rinse step to remove excess catalyst;
   (c) the important wipe step with a cloth to remove catalyst from the smooth crystalline non-etched areas; this step leaves the catalyst which was deposited in the etched areas in step (a);

(d) two more rinses in separate water baths;
(e) immersion in an accelerator solution to activate the catalyst;
(f) another rinse water immersion;
(g) a copper predip; and
(h) copper plating bath which deposits a layer of copper on the etched amorphous regions coated with catalyst.

The thickness of the copper after electroless plating depends on how long the piece is left in the final bath. If desired, after electroless plating, electroplating processes can be utilized to lay down as thick a copper layer as is necessary.

Electroless plating solutions are commercially available from many sources, but the solutions which have been utilized in the examples described below came from McGean-Rohco, Inc. Typical recipes, immersion times, and other details are shown in the following Table I:

TABLE I[a,b]

| Bath | Bath Recipe for 600 ml | Immersion times |
|---|---|---|
| Catalyst | 444 ml water<br>138 ml conc. HCl<br>18 ml LC-4[c] | 5 minutes |
| Accelerator | 500 ml water<br>12 ml conc. HCl<br>72 g D-25[c]<br>Dilute to 600 ml with water | 3 minutes |
| Copper Predip | 540 ml water<br>60 ml FL-1[c] | 1 minute |
| Electroless Copper Bath | 531 ml water<br>9 ml FL-2[c]<br>60 ml FL-1[c] | As long as required |

[a] All solutions were mixed and used at room temperature. They were placed in 1 liter, wide-mouth jars.
[b] Based upon McGean-Rohco, Inc. copper plating solutions.
[c] McGean-Rohco designation.

Electroplating

Pieces of poly(phenylene sulfide) material which have been electrolessly plated are attached to the negative terminal of a DC power supply and immersed in a plating bath containing copper ions. A thick piece of copper metal serves as both the other electrode and a source for copper ions for the bath. When power is applied, the copper ions in the bath are attracted to the poly(phenylene sulfide) material and are reduced and plates out upon contact with the electrolessly plated copper lines. This process continues as long as the power is on and is a way to lay down as thick a copper layer as is necessary.

It is critical in the electroplating process that there is a good electrical contact with the surfaces to be plated. This requirement has both positive and negative implications. On the positive side, small amounts of unwanted residual copper are removed from the piece by the bath. This has the effect of cleaning the piece and removing unwanted copper. On the negative side, it means that all circuit elements to be plated must be electrically connected during the electroplating process or they will be removed.

In the examples set forth below an HBS DC power supply rated at ten amps and nine volts was used for electroplating. One electrode, the positive, is a thick piece of copper ($3 \times 6 \times \frac{1}{4}$ inch) which is suspended so that about $\frac{3}{4}$ of its length is immersed. The other electrode is the piece to be plated. The plating solution is made as follows.

630 grams of concentrated reagent grade sulfuric acid was very slowly added to a large magnetically stirred beaker containing two liters of water, 270 grams $CuSO_4.5H_2O$, 15 mls. of McGean-Rohco E-339 Brightener, and 0.3 g of NaCl. After all these were mixed, the solution was diluted to a total of three liters with water.

A thick wall polyethylene tub containing this solution was placed on a magnetic stirrer. Then the sample and electrodes were put into the solution and the power turned up slowly. A small start-up current was used, then the current was increased until a working current of 20–30 amps/ft$^2$ was achieved. Too high a current causes burning and/or copper sand balls. This roughly translated to 0.5–0.8 mA per $\frac{3}{4}$ inch long line. In order to measure such small currents an ammeter was placed in series in the circuit. A general range for plating times and currents was one-half to two and one-half hours at 0.25–5.0 mA.

Example I

This first example was designed to demonstrate that the inventive process will copperplate amorphous poly(phenylene sulfide) but not crystalline poly(phenylene sulfide). Six pieces of amorphous extruded poly(phenylene sulfide) film were used, each being $1 \times \frac{1}{2} \times 0.020$ inch. Three of the pieces were crystallized by heating between smooth metal plates at 350° F. in a press for five minutes. One amorphous and one crystalline piece were treated as follows with the results indicated.

In the first test, the first two pieces received no pretreatment, and were directly electrolessly plated. No copper plating occurred on either piece.

In the second test, each of the two pieces was soaked for ten minutes in a solvent system comprised of a 70/30, v/v, mixture of nitromethane/methylene chloride. Again after the usual electroless plating process, no copper adhered to either of these pieces.

In the third test, each of the two pieces was etched for ten minutes in a four percent wt/vol nitrosonium hexafluorophosphate solution in a 70/30, v/v, mixture of nitromethane/methylene chloride, then electrolessly plated. The crystalline piece was smooth and copper free while the originally amorphous piece was completely copper plated.

Example II

Another experiment illustrates the process from start to finish using an electron beam to create the patterns to be plated. Five pieces of thick ($1\frac{1}{2} \times 1 \times 0.020$ inches) film were heat treated at 300°–350° F. and gently pressed between two polished metal plates for five minutes to produce crystalline samples with smooth surfaces. Each of these samples had several straight lines written on them in the scanning electron microscope under conditions as described above under the heading "Electron Beam". The resulting dark lines, clearly visible to the eye, were about 0.003–0.008 inch wide. Each piece was subjected to different post electron beam treatment and the peel strengths of the lines measured. The experimental treatments and peel strengths are listed in Table II below. Only the piece which had undergone the entire inventive process, i.e., sample 5, had a peel strength in the range required for use in commercial circuit boards.

TABLE II

| Sample No. | Treatment | Chart Value (g) | Width of Line (mils) | Peel Strength (lbs/in) |
|---|---|---|---|---|
| 1 | Direct Electroplating | 1.0 | 3.0–3.5 | 0.6–0.7 |
| 2 | Directly electrolessly plated and then electroplated | 1.3–1.5 | 3.5–4.5 | 0.6–0.9 |
| 3 | Solvent soaked, electrolessly plated, then electroplated | 3.0–6.0 | 3.2–4.0 | 1.9–4.1 |
| 4 | NOPF$_6$ etched, then electroplated | 1.0 | 4.2–5.0 | 0.4–0.5 |
| 5 | NOPF$_6$ etched, electrolessly plated, then electroplated | 6.5–9.5 | 3.0–8.0 | 2.0–7.0 |

Table II sets forth the peel strengths of the various samples. The peel strength of a metal trace is given in pounds per inch of width and reflects the quality of the metal to substrate bond. The values of 2–7 lbs/in given for example number 5 show considerable variability, but at least sometimes compare favorably with values of 4–8 lbs/in for lines on a commercial circuit board which was tested in the same manner. It is noted that determining accurately the width of the line is crucial and difficult, and has a significant impact on the final values calculated.

To measure peel strengths, the circuit was secured to one grip in an Instron testing machine. The other grip was carefully attached to the copper lines by means of a modified alligator clip. A full scale of 50–100 g was used and a peel speed of 2 in/min. The resulting chart values were recorded in Table II. The width of the line was measured by means of a graticule and an optical microscope. The final peel strength values were calculated by dividing the value from the chart by the width and converting from grams to pounds.

Thus it is seen that the articles and methods of the present invention readily achieve the ends and advantages mentioned as well as those inherent therein. While certain preferred embodiments of the invention have been described for purposes of the present disclosure, numerous changes may be made by those skilled in the art, which changes are encompassed within the scope and spirit of the present invention as defined by the appended claims.

What is claimed is:

1. A method for producing recessed plates paths on an article, comprising:
    (a) creating a pattern of areas of lesser crystallinity and areas of higher crystallinity in the polymer morphology of a surface of a poly(arylene sulfide) article;
    (b) exposing said surface to a chemical etchant selectively active upon said areas of lesser crystallinity and thereby etching said areas of lesser crystallinity while leaving said areas of higher crystallinity substantially unaffected so that said areas of lesser crystallinity become recessed with respect to said areas of higher crystallinity; and
    (c) after step (b), depositing a conductive metal on said recessed, etched areas of lesser crystallinity by electroless plating.

2. The method of claim 1, wherein:
    said step (a) is further characterized in that said surface is initially a crystalline surface and step (a) includes selectively treating said surface to form said areas of lesser crystallinity where said surface is treated.

3. The method of claim 2, wherein:
    said step (a) is further characterized in that said selective treating is performed by selectively exposing said surface to an electron beam to form said areas of lesser crystallinity where said surface is exposed to said electron beam.

4. The method of claim 1, wherein:
    said step (a) is further characterized in that said surface is initially a non-crystalline surface and step (a) includes selectively treating said surface to form said areas of higher crystallinity where said surface is treated.

5. The method of claim 4, wherein:
    said step (a) is further characterized in that said selective treating is performed by selectively heating said surface to form said areas of higher crystallinity where said surface is heated.

6. The method of claim 5, wherein:
    said step (a) is further characterized in that said accomplished with a laser beam.

7. The method of claim 4, wherein:
    said step (a) is further characterized in that said selective treating is performed by selectively exposing said surface to a solvent to form said areas of higher crystallinity where said surface is exposed to said solvent.

8. The method of claim 1, wherein:
    said step (b) is further characterized in that said chemical etchant is nitrosonium hexafluorophosphate.

9. The method of claim 8, wherein:
    said step (b) is further characterized in that said nitrosonium hexafluorophosphate is in a solvent.

10. The method of claim 9, wherein:
    said step (b) is further characterized in that said nitrosonium hexafluorophosphate is present in said solvent in a concentration of at least about 3% wt/vol.

11. The method of claim 9, wherein:
    said step (b) is further characterized in that said nitrosonium hexafluorophosphate is present in said solvent in a concentration of at least about 4% wt/vol.

12. The method of claim 9, wherein:
    said step (b) is further characterized in that said solvent is a 70/30 nitromethane/methylene chloride mixture.

13. The method of claim 1, wherein:
    said step (c) is further characterized in that said metal is copper.

14. The method of claim 1, wherein said poly(arylene sulfide) is poly(phenylene sulfide).

15. A method of forming recessed material patterns on a surface of a poly(phenylene sulfide) article, comprising:
    (a) tracing a pattern on the surface of said article with an electron beam, said pattern being of lesser crystallinity than a remainder of said surface;
    (b) exposing said surface to a chemical etchant selectively active on said pattern of lesser crystallinity so that said pattern of lesser crystallinity is recessed with respect to said remainder of said surface and thereby etching said pattern of lesser crystallinity; and
    (c) depositing a conductive metal on said etched pattern of lesser crystallinity by electroless plating to produce a recessed metal pattern on said surface.

16. The method of claim 15, wherein:
said step (b) is further characterized in that said chemical etchant is nitrosonium hexafluorophosphate.

17. The method of claim 16, wherein:
said step (b) is further characterized in that said nitrosonium hexafluorophosphate is in a solvent.

18. The method of claim 17, wherein:
said step (b) is further characterized in that said nitrosonium hexafluorophosphate is present in said solvent in a concentration of at least about 3% wt/vol.

19. The method of claim 17, wherein:
said step (b) is further characterized in that said nitrosonium hexafluorophosphate is present in said solvent in a concentration of at least about 4% wt/vol.

20. The method of claim 17, wherein:
said step (b) is further characterized in that said solvent is a 70/30 nitromethane/methylene chloride mixture.

21. The method of claim 15, wherein:
said step (c) is further characterized in that said metal is copper.

22. A method for producing recessed plates paths on an article, comprising:
(a) creating a pattern of areas of lesser crystallinity and areas of higher crystallinity in the polymer morphology of a surface of a poly(arylene sulfide) article;
(b) exposing said surface to a chemical etchant selectively active upon said areas of lesser crystallinity and thereby etching said areas of lesser crystallinity while leaving said areas of higher crystallinity substantially unaffected so that said areas of lesser crystallinity become recessed with respect to said areas of higher crystallinity; and
(c) after step (b), depositing a conductive metal on said recessed, etched areas of lesser crystallinity by electroless plating by:
(c) (1) exposing said surface to a catalyst bath;
(c) (2) wiping said surface to remove catalyst from said areas of higher crystallinity while leaving catalyst in said etched areas of lesser crystallinity;
(c) (3) depositing said conductive metal from a plating solution on said etched areas of lesser crystallinity containing said catalyst.

23. The method of claim 22 wherein:
said step (c) is further characterized in that said metal is copper.

24. A method for forming recessed metal patterns on a surface of a poly(phenylene sulfide) article, comprising:
(a) tracing a pattern on the surface of said article with an electron beam, said pattern being of lesser crystallinity than a remainder of said surface;
(b) exposing said surface to a chemical etchant selectively active on said pattern of lesser crystallinity so that said pattern of lesser crystallinity is recessed with respect to said remainder of said surface and thereby etching said pattern of lesser crystallinity; and
(c) depositing a conductive metal on said etched pattern of lesser crystallinity by electroless plating to produce a recessed metal pattern on said surface by:
(c) (1) exposing said surface to a catalyst bath;
(c) (2) wiping said surface to remove catalyst from said remainder of said surface while leaving catalyst in said etched pattern of lesser crystallinity; and
(c) (3) depositing said conductive metal from a plating solution on said etched pattern of lesser crystallinity containing said catalyst.

25. The method of claim 24 wherein:
said step (c) is further characterized in that said metal is copper.

* * * * *

UNITED STATES PATENT AND TRADEMARK OFFICE
CERTIFICATE OF CORRECTION

PATENT NO. : 5,211,803
DATED : May 18, 1993
INVENTOR(S) : Timothy W. Johnson et al.

It is certified that error appears in the above-identified patent and that said Letters Patent is hereby corrected as shown below:

Column 7, line 48, delete "plates" and insert --plated-- therefor.

Column 8, lines 3-4, delete "$CuSO_4.5H_2O$" and insert --$CuSO_4.5H_2O$-- therefor.

Column 8, line 26, after "being" insert --approximately--.

Column 9, line 49, delete "plates" and insert --plated-- therefor.

Column 10, line 21, after "said", second occurrence, and before "accomplished", insert --heating is--.

Column 11, line 24, delete "plates" and insert --plated-- therefor.

Column 12, lines 4-5, after "crystallinity;", insert --and--.

Signed and Sealed this

Eleventh Day of January, 1994

Attest:

BRUCE LEHMAN

Attesting Officer        Commissioner of Patents and Trademarks